(12) United States Patent
Johnson et al.

(10) Patent No.: US 10,986,723 B2
(45) Date of Patent: Apr. 20, 2021

(54) HEAT SINK TRAY FOR PRINTED CIRCUIT BOARDS

(71) Applicant: INGERSOLL-RAND INDUSTRIAL U.S., INC., Davidson, NC (US)

(72) Inventors: Joshua O. Johnson, Allentown, PA (US); Vairavasundaram Swaminathan, Bangalore (IN); Justin T. Chellew, Bethleham, PA (US)

(73) Assignee: INGERSOLL-RAND INDUSTRIAL U.S., INC., Davidson, NC (US)

( * ) Notice: Subject to any disclaimer, the term of this patent is extended or adjusted under 35 U.S.C. 154(b) by 0 days.

(21) Appl. No.: 16/161,868

(22) Filed: Oct. 16, 2018

(65) Prior Publication Data

US 2020/0120788 A1    Apr. 16, 2020

(51) Int. Cl.
| | |
|---|---|
| *H05K 1/02* | (2006.01) |
| *H05K 7/20* | (2006.01) |
| *H05K 3/28* | (2006.01) |
| *H05K 1/18* | (2006.01) |

(52) U.S. Cl.
CPC .......... *H05K 1/0209* (2013.01); *H05K 1/021* (2013.01); *H05K 1/186* (2013.01); *H05K 3/284* (2013.01); *H05K 7/20463* (2013.01); *H05K 2201/10409* (2013.01)

(58) Field of Classification Search
CPC ............. H05K 7/2039; H05K 7/20463; H05K 1/0201–0203; H01L 23/34–473
USPC ............................... 174/521, 526, 547–548; 361/679.46–679.54, 688–723
See application file for complete search history.

(56) References Cited

U.S. PATENT DOCUMENTS

| | | | |
|---|---|---|---|
| 3,616,533 A * | 11/1971 | Heap et al. .............. | H05K 3/34 174/526 |
| 5,835,350 A | 11/1998 | Stevens | |
| 5,898,572 A * | 4/1999 | Shennib .................... | G06F 1/20 181/202 |
| 5,926,373 A | 7/1999 | Stevens | |
| 6,005,773 A | 12/1999 | Rozman et al. | |
| 6,473,304 B1 | 10/2002 | Stevens | |
| 6,583,355 B2 * | 6/2003 | Skrzypchak ........... | H01L 21/56 174/521 |
| 6,856,209 B2 * | 2/2005 | Tsang .................... | H05K 1/0215 333/12 |
| 6,920,047 B2 | 7/2005 | Privett et al. | |
| 7,595,468 B2 * | 9/2009 | Moon ................ | H05K 7/20463 219/540 |
| 7,817,384 B2 | 10/2010 | Woods et al. | |
| 8,130,496 B2 * | 3/2012 | Dong .................. | B29C 45/0005 165/104.33 |
| 8,477,502 B2 | 7/2013 | Single et al. | |

(Continued)

FOREIGN PATENT DOCUMENTS

DE        10019471 A1      3/2001

OTHER PUBLICATIONS

Patentability Search Report dated Mar. 7, 2017.

*Primary Examiner* — Zachary Pape
(74) *Attorney, Agent, or Firm* — Kevin E. West; Advent, LLP

(57) ABSTRACT

The present invention provides a single-piece printed circuit board heat sink and encapsulation device configured to efficiently dissipate heat away from the printed circuit board, along with associated methodology for dispersing heat from a printed circuit board.

10 Claims, 10 Drawing Sheets

(56) References Cited

U.S. PATENT DOCUMENTS

| | | | |
|---|---|---|---|
| 8,657,031 B2 | 2/2014 | Kononenko et al. | |
| 8,964,401 B2 | 2/2015 | Escamilla et al. | |
| 9,137,916 B2* | 9/2015 | Fomage | H05K 3/284 |
| 9,401,250 B2 | 7/2016 | Velderman et al. | |
| 9,406,457 B2 | 8/2016 | Velderman et al. | |
| 9,480,185 B2* | 10/2016 | Linderman | H05K 1/0203 |
| 9,508,498 B2 | 11/2016 | Forster et al. | |
| 9,847,194 B2* | 12/2017 | Ekstrom | H01H 21/12 |
| 9,936,580 B1* | 4/2018 | Vinciarelli | B23K 1/0016 |
| 2002/0159233 A1 | 10/2002 | Patel et al. | |
| 2013/0119792 A1 | 5/2013 | Nishimiya et al. | |
| 2014/0027172 A1* | 1/2014 | Schillinger | H05K 5/0056 174/521 |
| 2014/0184097 A1* | 7/2014 | Luk | H05B 37/0254 315/297 |
| 2015/0280517 A1* | 10/2015 | Ekstrom | H01H 21/12 173/170 |
| 2016/0128208 A1 | 5/2016 | Bolik et al. | |
| 2018/0199461 A1* | 7/2018 | Huss | H05K 7/2039 |

\* cited by examiner

HEAT SINK TRAY FOR PRINTED CIRCUIT BOARDS

BACKGROUND

Technical Field

The following relates generally to the field of printed circuit boards, and more particularly relates to improved heat dissipation of a printed circuit board and associated components of power electronics, while allowing the printed circuit board assembly to be fully encapsulated for effective environmental protection.

State of the Art

Printed circuit boards (PCBs) commonly comprise delicate wire transistors, glass diodes, capacitors, resistors, semiconductors, silica chips, and other components, which help the PCBs to function property. Consequently, any damage to the components can cause the PCBs to fail. Damage often occurs because of short-out or component breakage. Devices having PCBs are found in many domestic, industrial, automotive and military applications, to name but a few. In such applications, the environments can cause electrical performance to deteriorate due to mechanical shock, the absorption of atmospheric moisture or electrostatic attraction of dust. Under more extreme conditions, exposure to corrosive atmospheres or harsh chemicals can further impair and even destroy PCB performance capability. To ensure reliability of these devices it is critical that the PCBs are protected to prevent reduced performance. This protection is commonly offered in the form of potting and encapsulation resins. The PCB is typically placed in a tray (sometimes called a "pot," "boat," "case," or "shell") and then one or more types of resin are poured in filling up the tray and covering the PCB to substantially encase it. By encapsulating the PCB, the resin provides environmental insulation for the unit, thereby combining good electrical properties with excellent mechanical protection. In addition, the increasing miniaturization and power of electronic components is not only accompanied by a need to provide environmental protection, but heat management is also critical to PCB performance. Electronic systems can fail when heat is not properly dissipated. It is, therefore, useful to incorporate heat sinks into the devices, so that heat may be effectively dissipated away from the PCBs and associated components. Common electronic motor drive components of typical handheld tools often utilize a two-piece design that includes a heat sink that is located in a separate tray so that a PCB encapsulated in the tray can dissipate heat through the heat sink. For example, FIG. 1 depicts a prior art two-piece PCB encapsulation device 5 having a small aluminum piece heat sink 10 that is located in a separate plastic tray 20 that, when structurally combined, provides a modest amount of heat dissipation and acts to facilitate encapsulation of the PCB and associated motor drive components, when resin is added. However, common two-piece designs, such as device 5, typically require the heat sink, such as heat sink 10, to be sealed to the tray, such as tray 20, prior to and during encapsulation. This sealing is an extra step that is both time consuming and inefficient. Moreover, because there are interfaces between the standard heat sink and tray, it is often difficult to maintain a good seal between the heat sink and the separate tray while adding potting and encapsulating material, and there is a potential for the potting and encapsulating material to escape. Hence, a need exists for a design that eliminates the inefficiencies associated with a separate heat sink.

SUMMARY

An aspect of the present disclosure includes a printed circuit board heat sink and encapsulation device comprising: a thermally conductive single-piece tray having a well configured for receiving a printed circuit board mountable to a portion of the well; wherein, the well is configured to receive thermally conductive potting material located between a mounted printed circuit board and the tray; and further wherein, when the well is substantially filled with the potting material, the mounted printed circuit board is substantially encapsulated, and the thermally conductive single-piece tray serves as a heat sink for the printed circuit board.

Another aspect of the present disclosure includes printed circuit board heat sink comprising: a substantially planar bottom portion; a side wall protruding upward from the bottom portion of the printed circuit board heat sink, wherein the side wall protrudes upward from the bottom portion so that the side wall forms an external boundary that is substantially similar in shape to the shape of an outer edge of a printed circuit board; wherein the printed circuit board heat sink is configured so that the printed circuit board is mountable to the bottom of the printed circuit board heat sink, when the printed circuit board is positioned within the external boundary formed by the protruding side wall; wherein the printed circuit board heat sink is configured to dissipate heat from the printed circuit board, when the printed circuit board is mounted to the printed circuit board heat sink; and wherein the printed circuit board heat sink is configured to receive and retain encapsulating material in a manner facilitating encapsulation of the printed circuit board, when the printed circuit board is mounted to the printed circuit board heat sink.

Still another aspect of the present disclosure includes method of dissipating heat from a printed circuit board, the method comprising: providing a single-piece printed circuit board heat sink tray, wherein the single-piece printed circuit board heat sink tray includes a well configured to substantially match the shape of a printed circuit board; mounting the printed circuit board to a substantially planar bottom surface of the well, when the printed circuit board is received within the well; dispensing potting material into the well, so that the well is substantially filled with the potting material, whereby the mounted printed circuit board is substantially encapsulated; and dissipating heat from the printed circuit board and into the single-piece printed circuit board heat sink tray, wherein the single-piece printed circuit board heat sink tray acts as a thermal dispersion reservoir to consistently draw heat from the printed circuit board to facilitate efficient thermal performance of the printed circuit board.

The foregoing and other features, advantages, and construction of the present disclosure will be more readily apparent and fully appreciated from the following more detailed description of the particular embodiments, taken in conjunction with the accompanying drawings.

BRIEF DESCRIPTION OF THE DRAWINGS

Some of the embodiments will be described in detail, with reference to the following figures, wherein like designations denote like members.

DETAILED DESCRIPTION OF EMBODIMENTS

Figure 1:
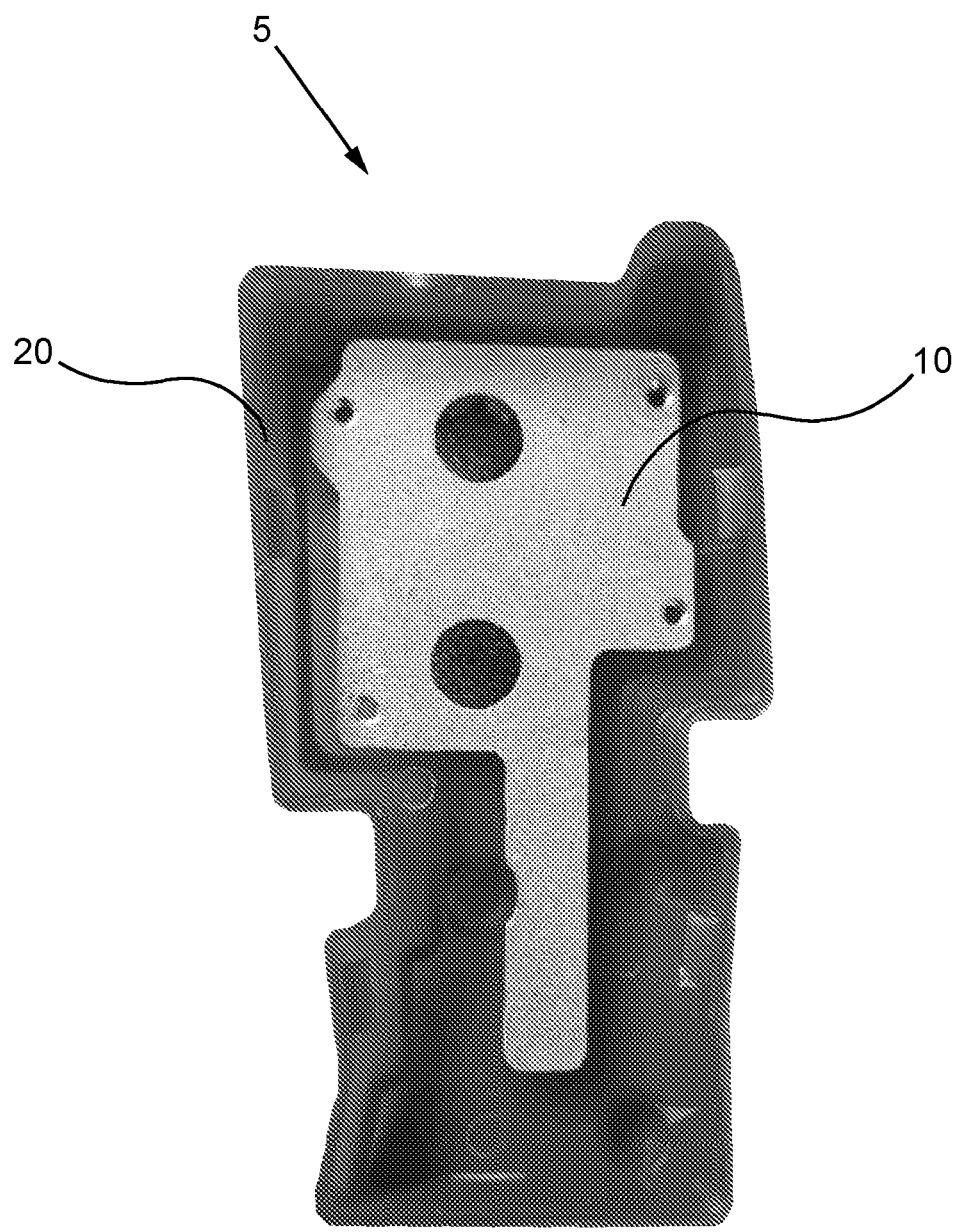
FIG. 1 is a top perspective view of an embodiment of a prior art two-piece printed circuit board encapsulation device having a separate heat sink.
Figure 2:
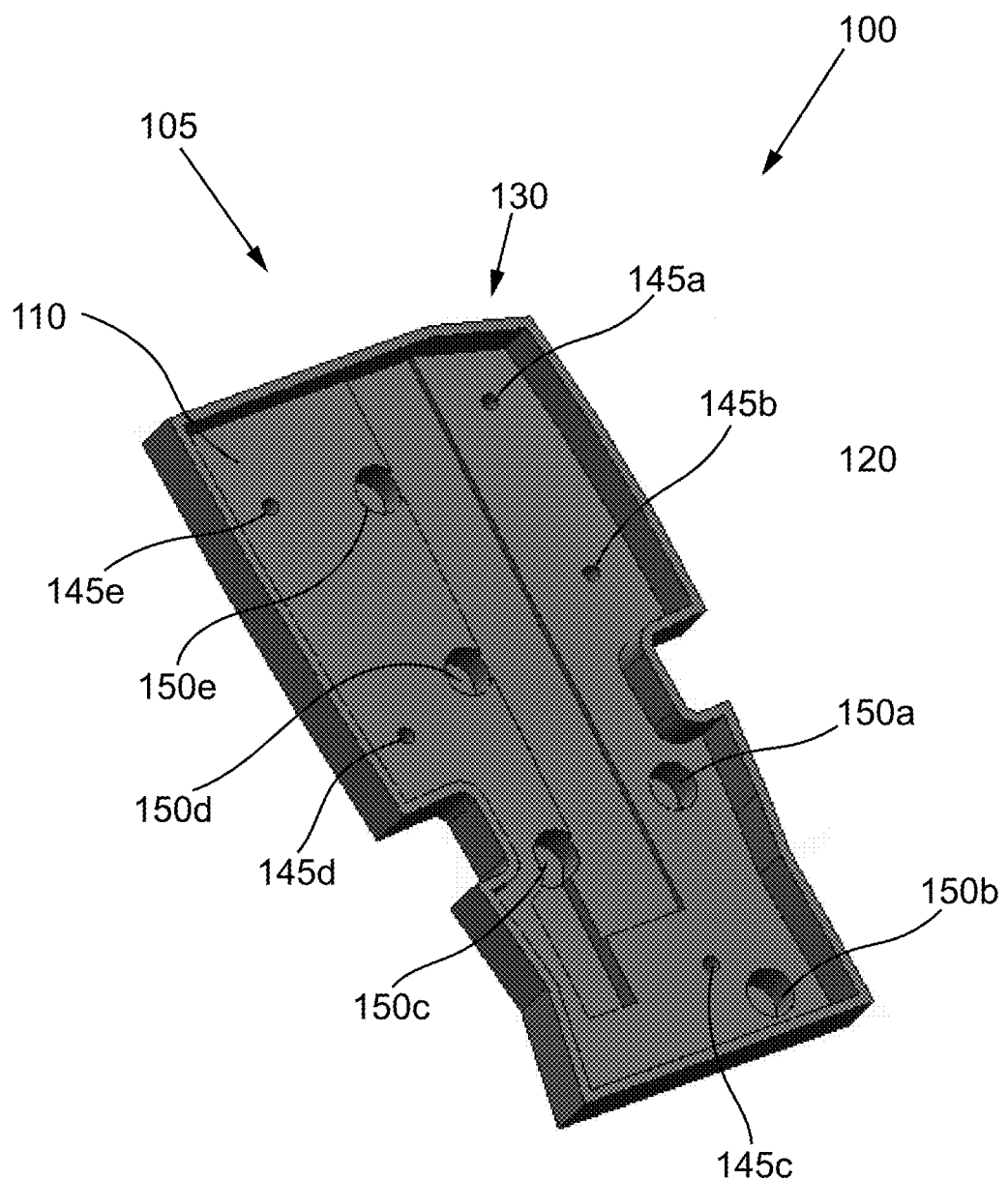
FIG. 2 is a perspective view of an embodiment of a single-piece heat sink and encapsulation device.

Referring now specifically to the drawings, a perspective view of an embodiment of a single-piece heat sink and encapsulation device 100, is illustrated and shown generally in FIG. 2. A single-piece heat sink and encapsulation device 100 may comprise a tray 105. The tray 105 may be formed as a single-piece structure via formation processes such as stamping, machining, molding, cutting, turning, drilling, etching, or other operable formation methods. Embodiments of a tray 105 may include a well 130. The well may be configured to receive and retain a volume of material(s) that may be put into it. Moreover, the well may be shaped to closely match the shape of a PCB, such as PCB 200 (see FIGS. 3-7), that may be positioned within the well 130. The well 130 may be configured for receiving a PCB mounted to a portion of the well 130. As such, the well 130 may be structurally bordered by side walls 120 that protrude and extend upward from a bottom surface 110 of the well 130. The side walls 120 may form an external boundary that is substantially similar in shape to the shape of an outer edge of a PCB, such as PCB 200 (see again, FIGS. 3-7).

The well 130 may be configured for receiving a PCB, such that the PCB is directly mountable to a portion of the well 130. For example, a side wall 120 of the well 130 may protrude upward from a bottom portion of the well so that the side wall 120 forms an external boundary of the well 130 that is substantially similar in shape to the shape of an outer edge 238 of the PCB 200. The heat sink and encapsulation device 100 may be configured so that the PCB 200 is mountable to the device 100, when the PCB 200 is positioned within the external boundary formed by the protruding side wall 120. The bottom surface 110 of the well 130 may be substantially planar, however, there may be features, such as holes, slots, bores, grooves, dimples, protrusions, openings, and other like formations that may be located in, on and/or existent with the bottom surface 110 of the well 130 of the tray 105 of a single-piece heat sink and encapsulation device 100. For example, the bottom surface 110 of the well 130 may include fastener holes, such as fastener holes 145a-145e. The fastener holes 145a-145e may be threaded, thereby facilitating threadable coupling with complimentary fasteners, such as screws or bolts associated with a PCB, to mount the PCB to the well 130. In addition, the bottom surface 110 of the well 130 may include PCB component compliment cavities, such as cavities 150a-150e, to receive, or otherwise provide structural compliment, corresponding to through-hole components potentially protruding from the underside of a PCB positioned within the well 130. For instance, a PCB component compliment cavity, such as a cavity 150a-150e, may permit a space for a portion of a PCB component, such as a soldered wire lead trace, a solder-free wire connector terminal, a receptacle lock, a connector pin, or other like protruding PCB component, to reside when the PCB is positioned near or against the bottom surface 110 of the well 130. The PCB component compliment cavities, such as cavities 150a-150e, may also help facilitate direct mounting of the PCB to the well 130 of a single-piece heat sink and encapsulation device 100.

Figure 3:
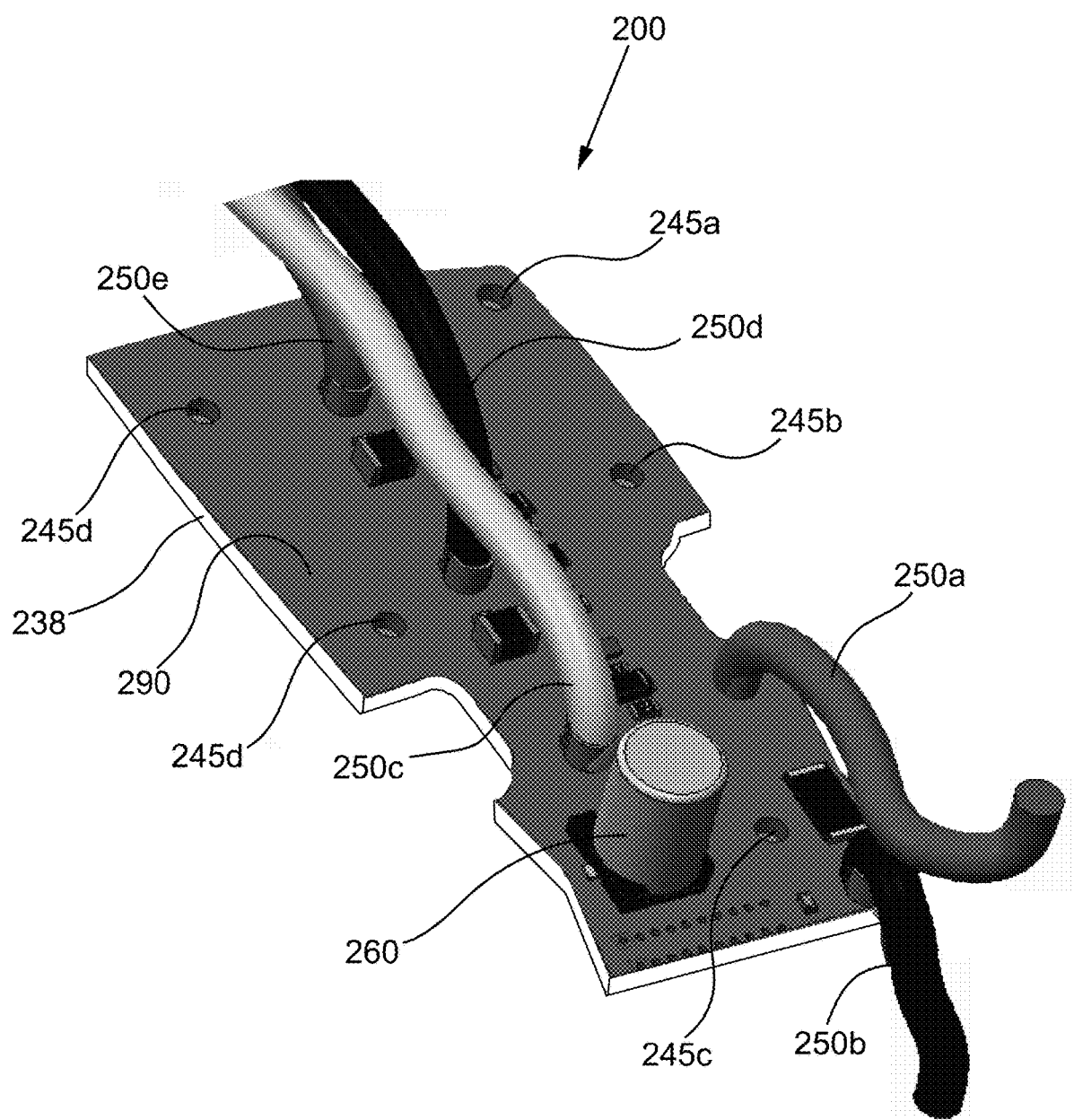
FIG. 3 is a perspective view of an embodiment of a printed circuit board having embodiments of various electronic components attached thereto.

With continued reference to the drawings, FIG. 3 depicts a perspective view of an embodiment of a PCB 200 having embodiments of various electronic components attached thereto. The PCB 200 may have an outer edge 238, wherein the outer edge 238 may be shaped to substantially correspond with the shape of a well 130 of a single-piece heat sink and encapsulation device 100. As should be understood by those of ordinary skill in the art, at least a top surface, such as top surface 290 of the PCB 200, may include conductive tracks, traces, pads, and/or other features etched, printed, plated, coated, engraved, laminated, milled, drilled, electrochemically grown, masked, soldered, or otherwise positioned onto the surface 290 to form electrical circuitry. The PCB may mechanically support and electrically connect various electronic components, such as resistors, capacitors, transistors, inductors, diodes, microchips, surface mount devices, through-hole devices, integrated circuits, wire leads, such as wire leads 250a-250e, and other like electronic components, such as electronic component 260. Some electronic components, such as wire leads 250a-250e, may extend through the PCB and protrude from the bottom surface 230 (see FIG. 7) of the PCB 200. Complimentary cavities, such as cavities 150a-150e, may be located on the bottom of the well 130 to provide space for electrical components that protrude from the bottom surface 230, when the PCB is located in the well 130 of tray 105.

Embodiments of a PCB 200 may be configured to mount directly to embodiments of a single-piece heat sink and encapsulation device 100. The PCB may include one or more through-holes, such as through-holes 245a-245e. The through-holes such as through holes 245a-245e, may be positioned to correspond with the location of fastener holes, such as fastener holes 145a-145e of tray 105, so that fasteners, such as screws or bolts, may secure the PCB 200 to the tray 105, when it is mounted to the well 130.

Figure 4:
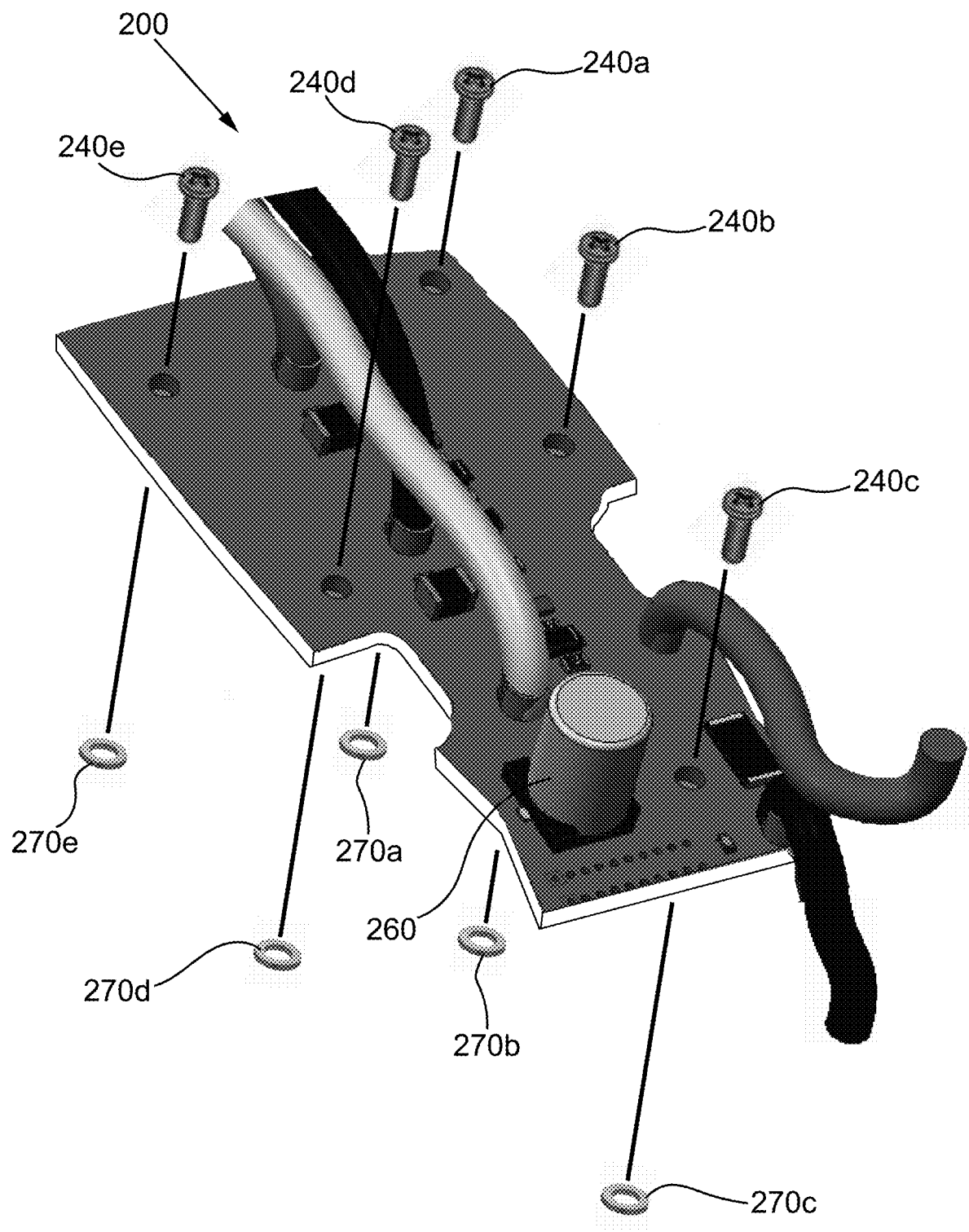
FIG. 4 is a perspective view of an embodiment of a printed circuit board having embodiments of various electronic components attached thereto, with embodiments of exploded fasteners and spacers.

Referring further to the drawings, FIG. 4 depicts a perspective view of an embodiment of a PCB 200 having embodiments of various electronic components, such as electronic component 260, attached thereto, with embodiments of exploded fasteners, such as machine screws 240a-240e, and spacers, such as washers 270a-270e. The fasteners, such as machine screws 240a-240e, may be sized to extend through openings of the PCB, such as corresponding through-hole openings 245a-245e, and into fastener holes, such as corresponding fastener holes 145a-145e, in the bottom of well 130 to secure the PCB 200 to the tray 105. The fasteners may be formed of conductive materials, such as metals and/or metal alloys, etc., or the fasteners may be formed of substantially non-conductive materials, such as plastics and/or composite materials. Additionally, embodiments of a single-piece heat sink and encapsulation device 100 may operate with spacers. The spacers, such as washers 270a-270e, may be sized so that the fasteners, such as fasteners 240a-240e, may extend through them, while the spacers are positioned to space the PBC 200 off the very bottom of well 130, when the PCB is mounted to the well 130 by the fasteners, such as machine screws 240a-240e. The spacers may be formed of conductive materials, such as metals and/or metal alloys, etc., or the spacers may be formed of substantially non-conductive materials, such as plastics and/or composite materials.

Figure 5:
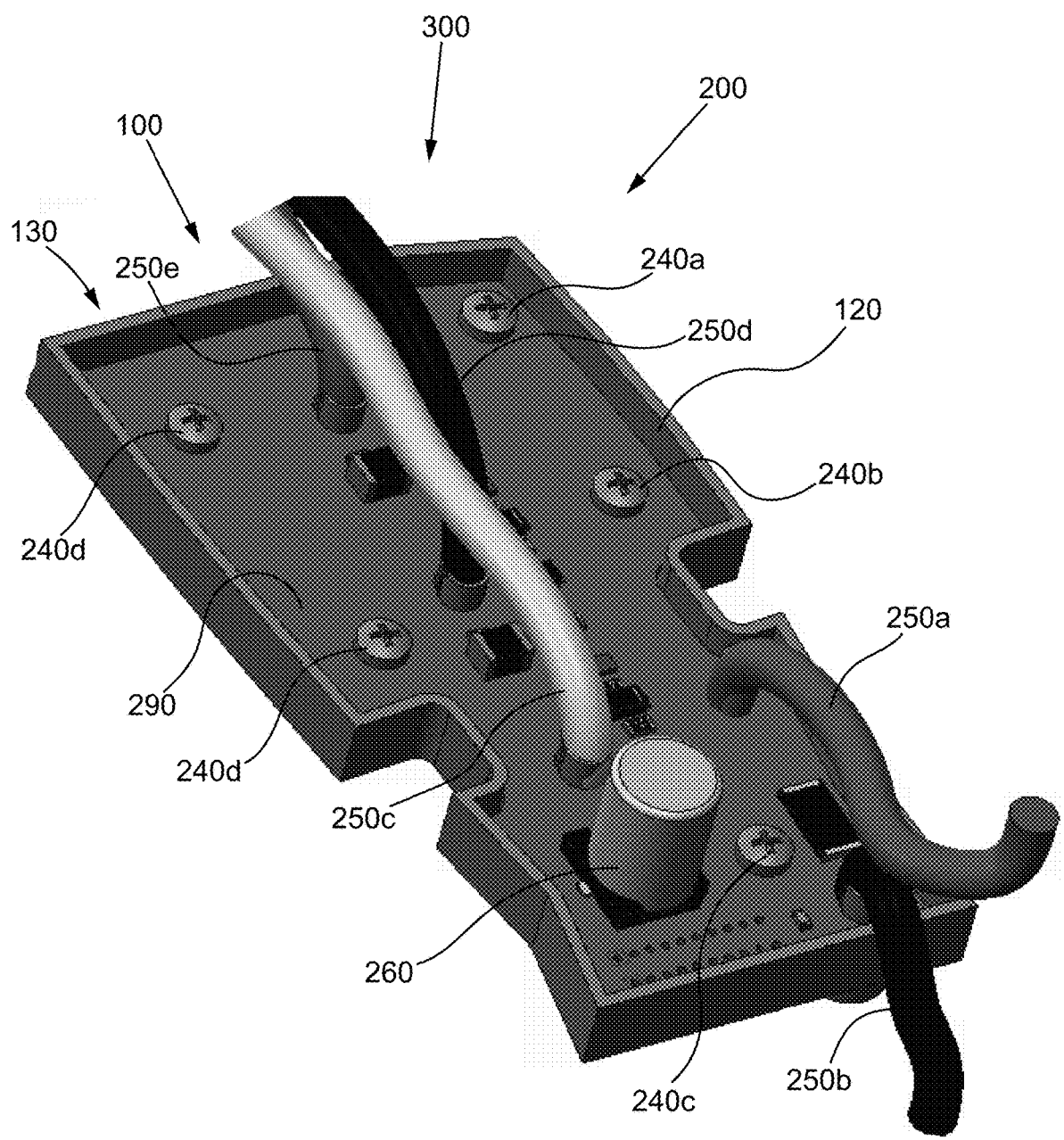
FIG. 5 is a perspective view of an embodiment of a printed circuit board having various attached electronic components, wherein the printed circuit board is mounted to an embodiment of a single-piece heat sink and encapsulation device via fasteners.

With still further reference to the drawings, FIG. 5 depicts a perspective view of an embodiment of a PCB 200 having various attached electronic components, such as attached electronic component 260, wherein the PCB 200 is mounted to an embodiment of a single-piece heat sink and encapsulation device 100 via machine screw fasteners 240a-240e. The single-piece heat sink and encapsulation device 100 may be configured such that, when the PCB 200 is mounted thereto, the PCB 200 substantially covers the bottom of well 130. The single-piece heat sink and encapsulation device 100 may be configured to dissipate heat from the PCB 200, when the PCB 200 is mounted to the single-piece heat sink and encapsulation device 100. The mounting of PCB 200 to the single-piece heat sink and encapsulation device 100 may form a joint PCB-Tray combined unit 300. The joint PCB-Tray combined unit 300 may be configured so that a significant volume of well 130 is void of material, wherein the void may eventually be filled with potting material to encapsulate the PCB 200.

Figure 6:
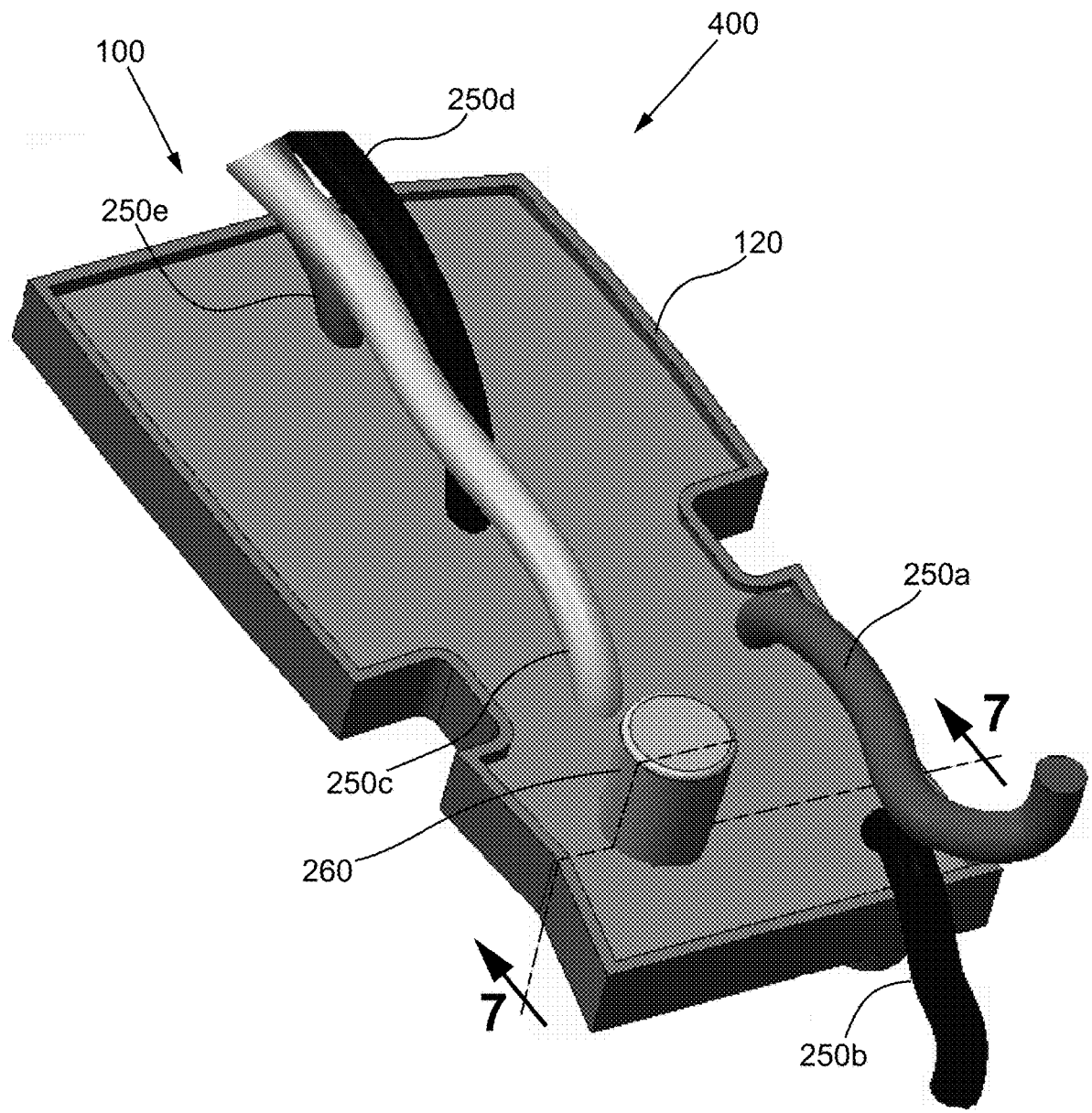
FIG. 6 is a perspective view of an embodiment of a printed circuit board (not visible) having various electronic components (partially visible), wherein the printed circuit board is attached to and substantially encapsulated within an embodiment of a single-piece heat sink and encapsulation device.

As shown in perspective in FIG. 6, an embodiment of a PCB (such as PCB 200, which is not visible) having various electronic components (such as electronic component 260, which is partially visible) may be attached to and substantially encapsulated within an embodiment of a single-piece heat sink and encapsulation device 100. The encapsulation of the PCB 200 may be facilitated by dispensing potting material into the well 130, while the PCB 200 is mounted to tray 105, so that the potting material surrounds the PCB 200 and substantially fills the well 130. Those in the art will appreciate that a substantially filled well 130 does not mean that the potting material must fill the well to the very top of the side walls 120 of tray 105, but rather that a substantial portion of the volume of the well 130 has been filled by potting material. Moreover, those of ordinary skill in the art will also recognize a substantially encapsulated PCB 200 does not have to be completely encased by potting material, but rather that a considerable portion of the PCB 200, including the attached electronic components has been covered by potting material, so that the PCB 200 and operable electrical componentry have been essentially encased and functionally protected. Some insignificant portions of the PCB 200 may remain exposed and/or some parts of the attached electronic components may not be fully covered by potting material, but the encapsulation is substantially complete. For example, as depicted in FIG. 6, the well 130 is substantially filled with potting material, even though the potting material does not cover the entirety of side walls 120, and the PCB 200 is substantially encapsulated, even though there is a portion of electronic component 260 that remains exposed. The PCB 200, as mounted to and encapsulated within the well 130 of the single-piece heat sink and encapsulation device 100, may jointly therewith comprise an encapsulated PCB unit 400.

Figure 7:
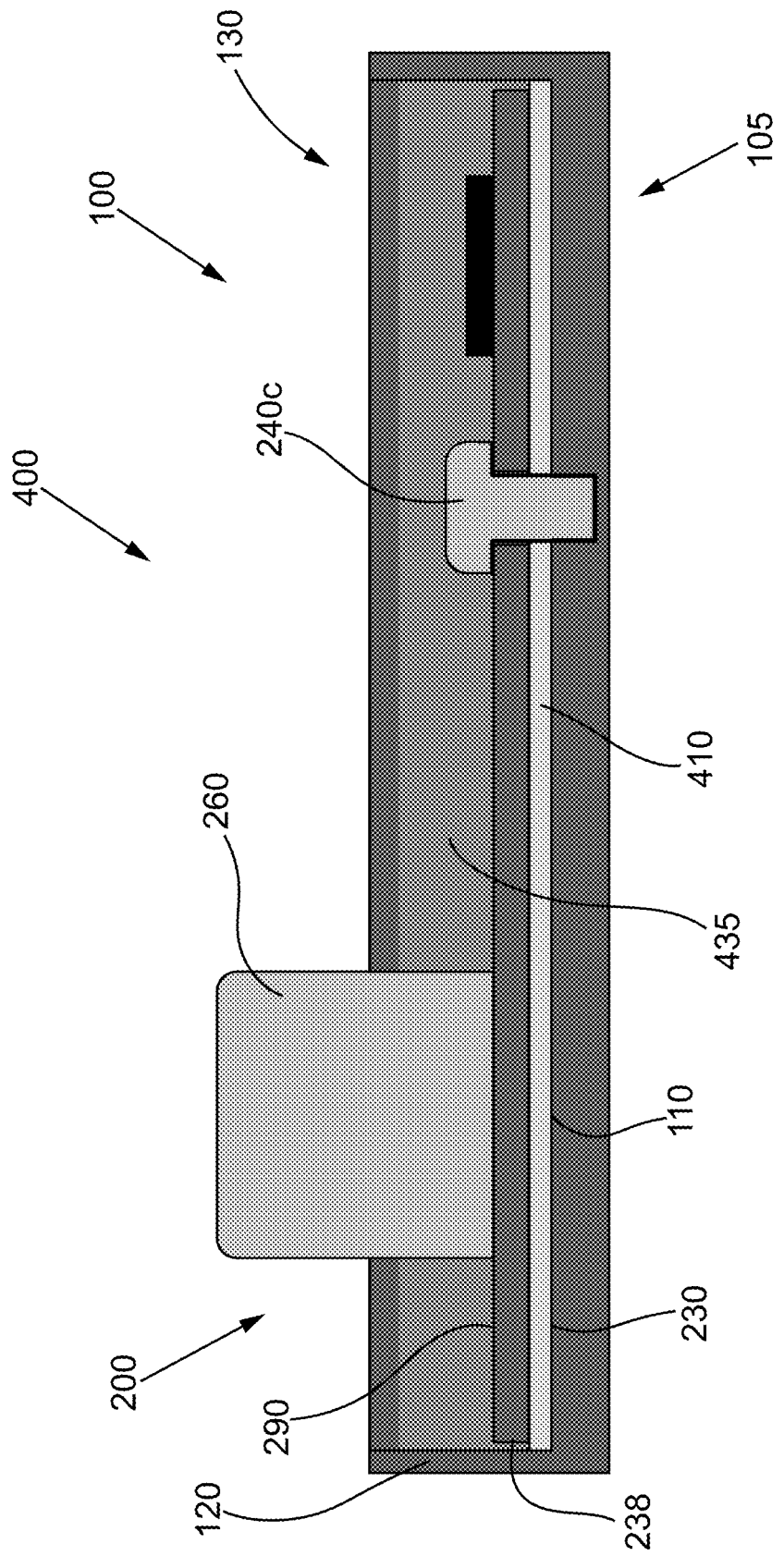
FIG. 7 is a side cross-section view of a portion of an embodiment of a printed circuit board having various electronic components, wherein the printed circuit board is mounted to and substantially encapsulated within an embodiment of a single-piece heat sink and encapsulation device, as depicted in FIG. 6.

With continued reference to the drawings, FIG. 7 depicts a side cross-section view of a portion of an embodiment of a PCB 200 having various electronic components, such as electronic component 260, wherein the PCB 200 is mounted to and substantially encapsulated within an embodiment of a single-piece heat sink and encapsulation device 100, as depicted in FIG. 6. As depicted, a single-piece PCB heat sink and encapsulation device 100 may encapsulate and disperse heat from a PCB, such as PCB 200, by attaching itself to the PCB 200, via fasteners, such as machine screws 240a-240e. Heat from the PCB 200 and associated electronic components may be transferred to the heat sink tray 105. A Sil-Pad®, or other thermal interface product 410, may be placed in between the heat sink tray 105 and PCB 200. Washers, such as stand-off washers 270a-270e (not shown), may also be placed between the PCB 200 and the heat sink tray 105. After attaching the heat sink tray 105 to the PCB 200, with any other components appropriately securely located within the heat sink tray 105, potting material may be dispensed into the well 130 of the tray 105 and may flow and otherwise surround the PCB 200 and substantially fill up the well 130 of tray 105 and substantially encapsulate the PCB 200 and associated electronic components. Since the heat sink and encapsulation device 100 is one single piece, there are no interfaces where the potting and encapsulation material 435 can escape. Moreover, the size or mass relationship between the heat sink boat or tray 105 and the PCB 200 may help facilitate efficient heat transfer—i.e., the single piece design increases the mass of the heat sink above common tray designs, which also increases the heat dissipation effect. The tray 105 may be configured to be a large enough thermal reservoir (with enough mass and surface area) that heat generated by the PCB 200 continuously tends to flow from the PCB 200 into the reservoir and is efficiently dispersed away from the reservoir, so that the dispersion rate of the reservoir is faster than the rate of heat dissipated by the PCB 200 into the reservoir. Heat dispersion may, therefore, initially function through conduction means (from the PCB 200 to other less thermally sensitive components) and may further involve convection into environmental gas flows potentially moving past the surface of the heat sink tray 105, and/or radiation to the surrounding environment. The thermal dispersion rate of the single-piece heat sink and encapsulation device 100 is faster than the rate of heat dissipated by the PCB 200 into the single-piece heat sink and encapsulation device 100.

Figure 8:
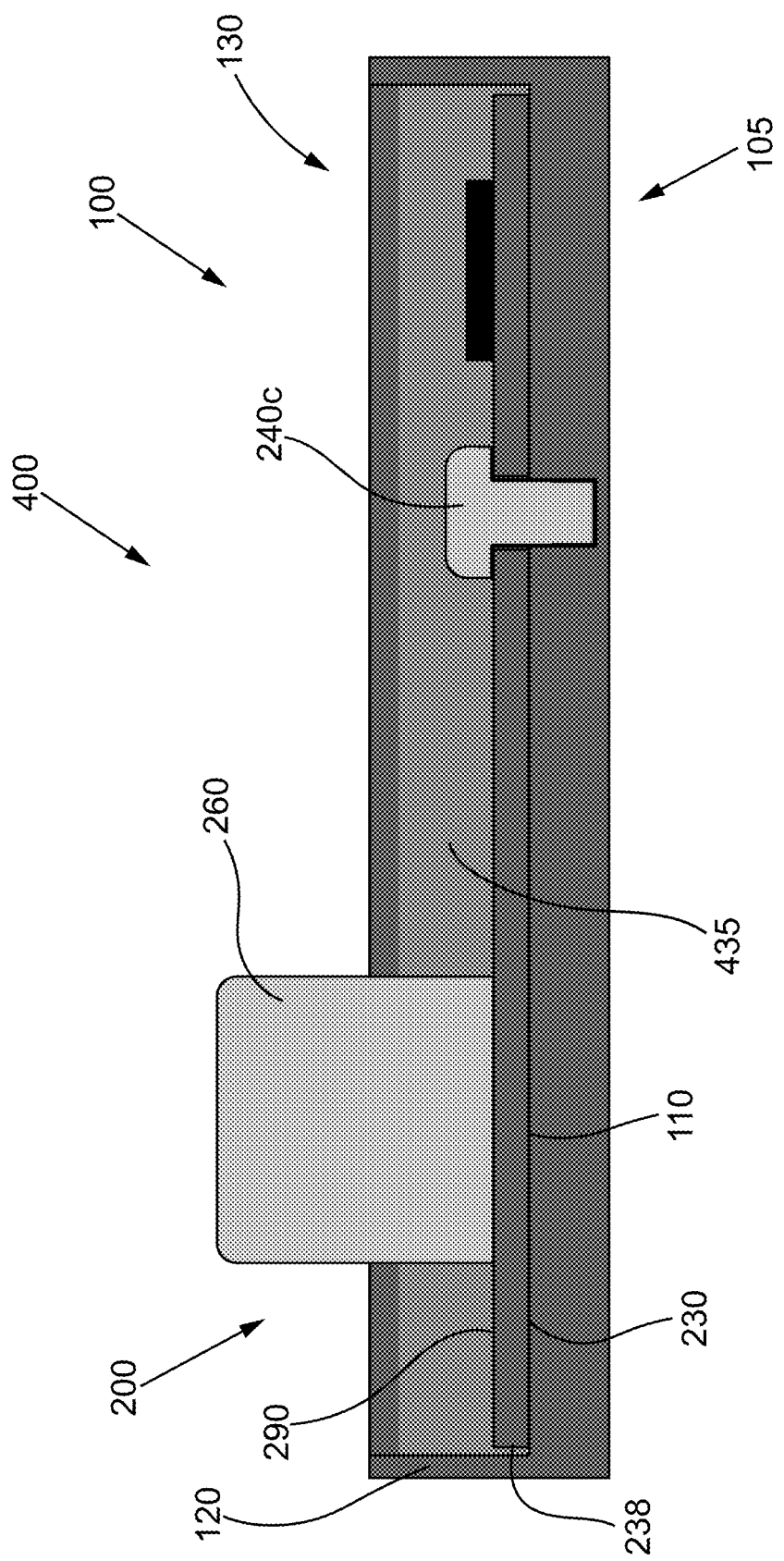
FIG. 8 is a side cross-section view of a portion of another embodiment of a printed circuit board having various electronic components, wherein the printed circuit board is mounted to and substantially encapsulated within another embodiment of a single-piece heat sink and encapsulation device, as depicted in FIG. 6.

With further reference to the drawings, FIG. 8 depicts a side cross-section view of another embodiment of a portion of a PCB 200 having various electronic components, such as electronic component 260, wherein the PCB 200 is mounted to and substantially encapsulated within another embodiment of a single-piece heat sink and encapsulation device 100, as also potentially depicted in FIG. 6. As embodied, the PCB 200 is mounted directly to the bottom surface 110 of the heat sink tray 105. Mounting is effectuated by fasteners, such as machine screw 240c. When secured within the heat sink tray 105, the PCB and applicable electronic components may be encapsulated by potting material 435 that may be filled into the tray 105. As encapsulated, heat may be dissipated from the PCB 200 and into the single-piece printed circuit board heat sink tray 105, wherein the single-piece printed circuit board heat sink tray 105 may acts as a thermal dispersion reservoir to consistently draw heat from the PCB 200, to facilitate efficient thermal performance of the PCB 200.

Figure 9:
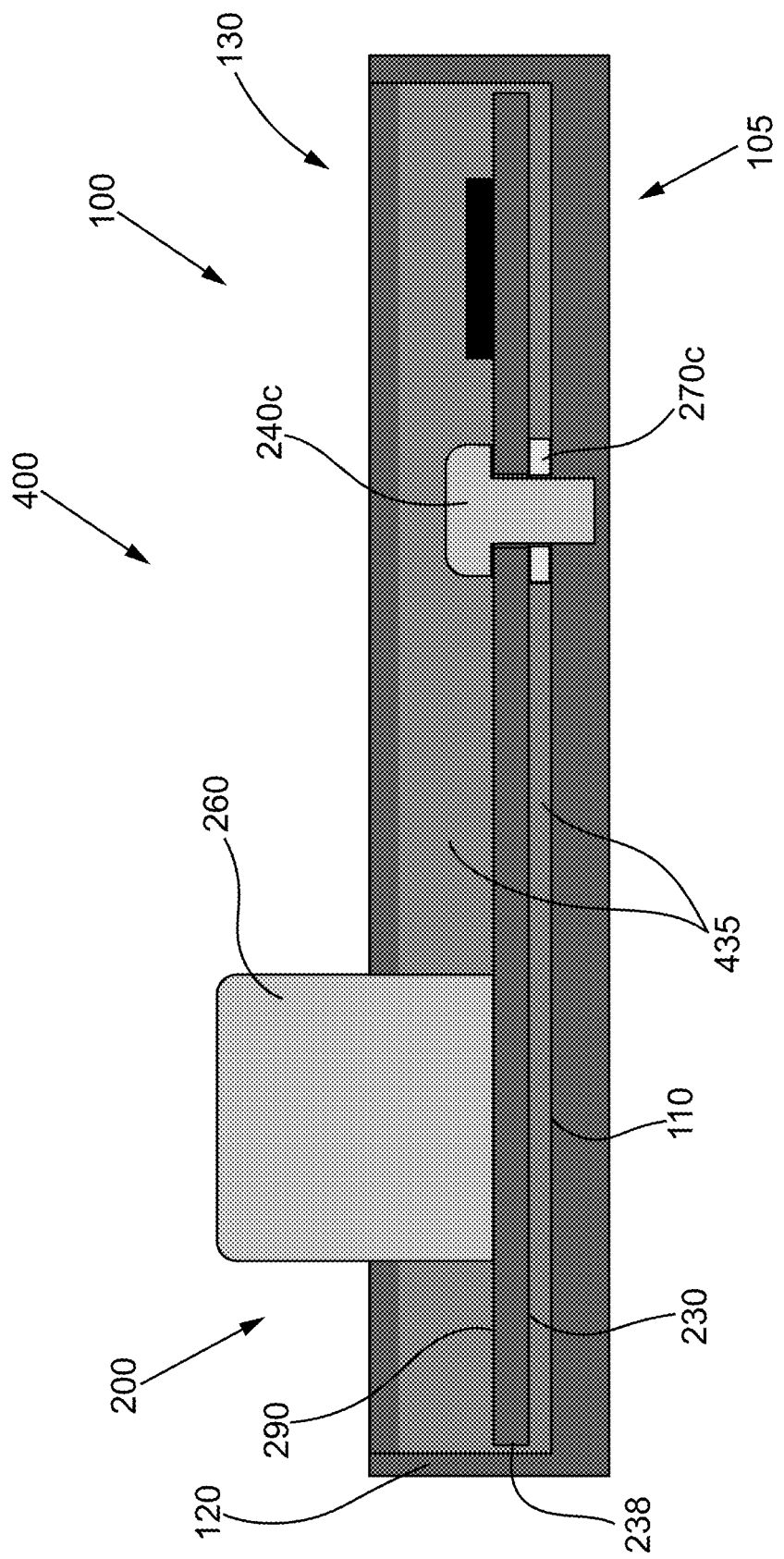
FIG. 9 is a side cross-section view of a portion of still another embodiment of a printed circuit board having various electronic components, wherein the printed circuit board is mounted to and substantially encapsulated within still another embodiment of a single-piece heat sink and encapsulation device, as depicted in FIG. 6.
Figure 10:
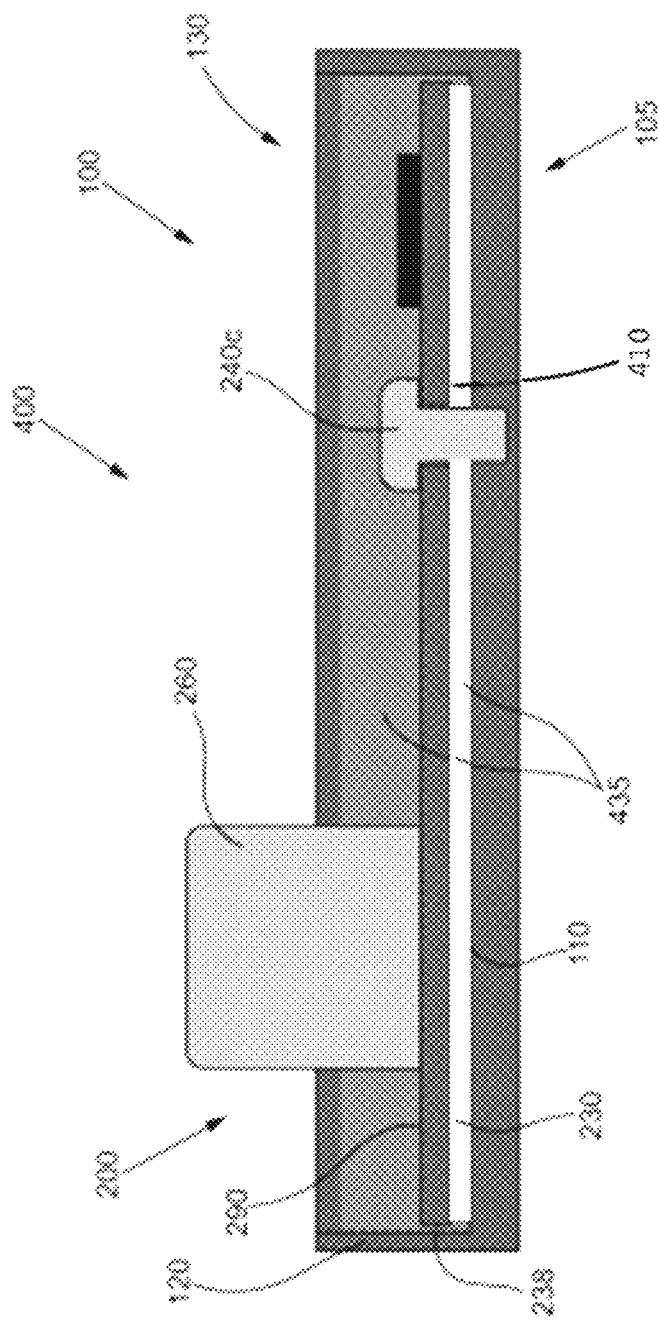
FIG. 10 is a side cross-section view of a portion of another embodiment of a printed circuit board having various electronic components, where a thermal interface product is inserted between the printed circuit board and a tray of a single piece heat sink and encapsulation device, as depicted in FIG. 6.

With still further reference to the drawings, FIG. 9 depicts a side cross-section view of yet another embodiment of a portion of a PCB 200 having various electronic components, such as electronic component 260, wherein the PCB 200 is mounted to and substantially encapsulated within a further embodiment of a single-piece heat sink and encapsulation device 100, as also potentially depicted in FIG. 6. A PCB, such as PCB 200, may be mounted to a heat sink tray 105 via fasteners, such as machine screws 240a-240e, and spaced off the PCB 200 via stand-off washers 270a-270e. Heat from the PCB 200 and associated electronic components may be further transferred to the heat sink tray 105 via a thermally conductive compound, such as potting and encapsulation material 435, placed in between the heat sink tray 105 and PCB 200. Accordingly, after attaching the heat sink tray 105 to the PCB 200, potting material may be dispensed into the well 130 of the tray 105 and may flow and otherwise surround the PCB 200, including underneath the PCB 200, and substantially fill up the well 130 of tray 105, thereby substantially encapsulating the PCB 200 and associated electronic components. Heat dispersion may, therefore, initially function through conduction means (from the PCB 200 to other less thermally sensitive components, including the thermally conductive potting material 435), and may further involve convection into environmental gas flows potentially moving past the surface of the heat sink tray 105, and/or radiation to the surrounding environment. The thermal dispersion rate of the single-piece heat sink and encapsulation device 100, including the thermally conductive encapsulation material 435, is faster than the rate of heat dissipated by the PCB 200 into the single-piece heat sink and encapsulation device 100.

While this disclosure has been described in conjunction with the specific embodiments outlined above, it is evident that many alternatives, modifications and variations will be apparent to those skilled in the art. Accordingly, the embodiments of the present disclosure as set forth above are intended to be illustrative, not limiting. Various changes may be made without departing from the spirit and scope of the present disclosure, as required by the following claims. The claims provide the scope of the coverage of the present disclosure and should not be limited to the specific examples provided herein.

What is claimed is:

1. A printed circuit board heat sink and encapsulation device comprising:

a thermally conductive single-piece tray having a well configured for receiving a printed circuit board mountable to a portion of the well;

wherein the well is configured to receive thermally conductive potting material located between a mounted printed circuit board and the tray;

wherein, when the well is substantially filled with the potting material, the mounted printed circuit board is substantially encapsulated, and the thermally conductive single-piece tray serves as a heat sink for the printed circuit board;

wherein the well has an outer boundary that is substantially similar in shape to the shape of a non-linear outer edge of the printed circuit board received in the well;

wherein the bottom surface of the well of the single-piece tray also comprises printed circuit component compliment cavities;

wherein the bottom surface of the well includes a recess track structured to receive a plurality of printed circuit components; and wherein the recess track intersects the printed circuit component compliment cavities.

2. The printed circuit board heat sink and encapsulation device of claim 1, wherein the well comprises a substantially planar bottom portion and a side wall protruding upward from the bottom portion so that the side wall forms an external boundary that is substantially similar in shape to the shape of more than one non-linear edge of the printed circuit board.

3. The printed circuit board heat sink and encapsulation device of claim 1, wherein the potting material is also placed between the printed circuit board and a bottom surface of the well.

4. The printed circuit board heat sink and encapsulation device of claim 3, wherein the printed circuit board is mounted to the single-piece tray via threaded fasteners extending through the printed circuit board and threadably coupled to threaded fastener holes.

5. The printed circuit board heat sink and encapsulation device of claim 4, wherein washers are positioned around the threaded fasteners and located between the printed circuit board and the bottom surface of the well, when the printed circuit board is mounted to the single-piece tray.

6. The printed circuit board heat sink and encapsulation device of claim 1, wherein the recess track includes a first recess level and a second recess level.

7. A printed circuit board heat sink comprising:

a substantially planar bottom portion;

a side wall protruding upward from the bottom portion of the printed circuit board heat sink, wherein the side wall protrudes upward from the bottom portion so that the side wall forms an external boundary that is substantially similar in shape to the shape of an outer edge of a printed circuit board;

wherein the planar bottom portion and side wall are configured so that the printed circuit board is mountable to the bottom of the printed circuit board heat sink, when the printed circuit board is positioned within the external boundary formed by the protruding side wall;

wherein the printed circuit board heat sink is configured to dissipate heat from the printed circuit board, when the printed circuit board is mounted to the printed circuit board heat sink;

wherein the printed circuit board heat sink is configured to receive and retain encapsulating material in a manner facilitating encapsulation of the printed circuit board, when the printed circuit board is mounted to the printed circuit board heat sink;

wherein the printed circuit board is mounted to the substantially planar bottom portion, by threaded fasteners that extend through the printed circuit board and fasten into fastener holes correspondingly located on the substantially planar bottom portion;

wherein washers are located between the printed circuit board and the substantially planar bottom portion, when the printed circuit board is mounted to the substantially planar bottom portion;

wherein encapsulating material is placed between the printed circuit board and the substantially planar bottom portion, when the printed circuit board is mounted to the substantially planar bottom portion;

wherein the substantially planar bottom includes printed circuit component compliment cavities; and wherein the substantially planar bottom includes a recess track structured to receive a plurality of printed circuit components.

8. The printed circuit board heat sink of claim 7, further comprising a sil-pad between the printed circuit board and the heat sink when the printed circuit board is mounted to the substantially planar bottom portion.

9. The printed circuit board heat sink of claim 7, wherein the encapsulating material is a thermally conductive compound.

10. The printed circuit board heat sink of claim 9, wherein heat from the mounted printed circuit board is transferred to the printed circuit board heat sink via the thermally conductive encapsulating material, placed in between the substantially planar bottom portion and the mounted printed circuit board.

* * * * *